(12) United States Patent
Fujimori

(10) Patent No.: US 6,740,532 B2
(45) Date of Patent: May 25, 2004

(54) METHOD OF MANUFACTURING A FERROELECTRIC THIN FILM

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/218,988

(22) Filed: Aug. 13, 2002

(65) Prior Publication Data

US 2003/0054572 A1 Mar. 20, 2003

(30) Foreign Application Priority Data

Aug. 14, 2001 (JP) ..................... P. 2001-246070

(51) Int. Cl.$^7$ ............................................. H01L 21/00
(52) U.S. Cl. ............................................. 438/3
(58) Field of Search ..................... 438/3, 785

(56) References Cited

U.S. PATENT DOCUMENTS

| | | | |
|---|---|---|---|
| 5,913,117 A | * 6/1999 | Lee | ............................. 438/240 |
| 5,972,096 A | * 10/1999 | Sawada et al. | ......... 106/287.18 |
| 2002/0115307 A1 | * 8/2002 | Lee et al. | .................... 438/785 |
| 2002/0182754 A1 | * 12/2002 | Suenaga et al. | ............... 438/3 |

* cited by examiner

Primary Examiner—Michael S. Lebentritt
Assistant Examiner—Beth E. Owens
(74) Attorney, Agent, or Firm—Merchant & Gould, P.C.

(57) ABSTRACT

The invention provides a method for forming a ferroelectric thin film that is uniform and good in crystallinity. The method includes applying a liquid to a surface of a substrate. The liquid includes ultra-fine particle powder comprising at least one element constituting the ferroelectric thin film to a surface of a substrate. The liquid applied to the surface of substrate is then baked.

4 Claims, 5 Drawing Sheets

METHOD OF MANUFACTURING A FERROELECTRIC THIN FILM

BACKGROUND OF THE INVENTION

The present invention relates to a method of manufacturing a ferroelectric thin film and a method of manufacturing a ferroelectric memory, particularly to improve the crystallinity of the ferroelectric thin film.

The ferroelectric memory being researched now is divided into two main areas. One is directed to a system for detecting reverse charge quantity of a ferroelectric capacitor constructed with the ferroelectric capacitor and a selective transistor.

Another is directed to a memory of a system for detecting a change of resistance of a semiconductor caused by a spontaneous polarization of the ferroelectric substance. A typical example of this type of system is a MFSFET. This is an MIS structure using the ferroelectric substance for a gate insulating film.

In any structure, it is known that film quality of the ferroelectric substance affects the characteristics of memory significantly.

Then, various methods for improving the crystallinity of the ferroelectric thin film are proposed. As one of them, a method of crystallization of a PZT thin film called Ti seed method is proposed.

As shown in FIG. 7, the method includes forming a seed layer 9L consisting of titanium ultra thin film of about 20 nm film thickness on a surface of a lower electrode 8 consisting of platinum Pt and the like by spattering method and to form a PZT film 9P on the upper layer by sol-gel method as shown in FIG. 7. Here, mixed solution of $Pb(CH_3COO)_2 \cdot 3H_2O$, $Zr(t-OC_4H_9)_4$, and $Ti(i-OC_3H_7)_4$ is used as a starting material, after spin-coating the mixed solution, is dried at 150° C., and temporary baking of 400° C. for 30 minutes is performed under a dry air atmosphere. After repeating this five times, crystal growth from the ultra thin film 9L appears through crystallization annealing process of about 700° C., one minute in atmosphere of $O_2$.

In the method, there has been a problem that particle diameter of crystal can not be controlled because a place where crystallization starts is unstable and dispersion of characteristic is large because uniform size columnar crystal is formed so as not to obtain suitable characteristics, particularly at micronization and high integration.

There has been a problem that the method has a place becoming titanium oxide layer ($TiO_2$) or lead titanate ($PbTiO_3$) layer without becoming PZT film so as to obtain good characteristics.

There has been a problem that the method negatively affects the substrate layer, for example, by negatively affecting substrate wiring because the temperature at crystallization annealing is high at about 700° C.

SUMMARY OF THE INVENTION

The invention is performed in view of the circumstances, and an object of the invention is to provide a ferroelectric thin film that is uniform and good in crystallinity.

The invention is characterized by forming a seed layer including ultra-fine particle powder including composing element of a ferroelectric substance thin film on a surface of a substrate constructing the substrate before forming the ferroelectric substance thin film and forming the ferroelectric substance thin film on an upper layer of the seed layer so as to performing crystallization making the seed layer a nucleus.

According to such a construction, it is possible to obtain a ferroelectric thin film that is uniform and good in crystallinity because crystallization advances well making the ultra-fine particle powder a nucleus by existence of the ultra-fine particle powder. It is desirable to make the ultra-fine particle powder from 0.5 nm to about 200 nm particle diameter, particularly from 1 nm to about 50 nm particle diameter.

Incidentally, some minimum number of atoms is needed for the ultra-fine particle powder to become a nucleus, as the ultra-fine particle powder can not become the nucleus with one atom, and it is desirable to be sufficiently larger than the atomic size of about 0.1 nm. On the other hand, when the nucleus is too large, the center of the nucleus remains as Ti. Therefore, high annealing temperature is needed for converting Ti. It is impossible to form a flat and uniform ferroelectric thin film when the size is larger than 200 nm. The nucleus is hard to scatter in solution when the nucleus is large.

Further, the concentration is desirable to be from 0.00001 wt % (0.1 wtppm) to about 1 wt %.

Desirably, the invention is characterized by including a process forming a seed layer including titanium ultra-fine particle powder becoming a seed and a process forming a PZT thin film on the upper layer of the seed layer.

According such a construction, it is possible to obtain a PZT ferroelectric thin film that is uniform and good in crystallinity because crystallization advances well, thereby making the titanium ultra-fine particle powder a nucleus by the presence of the titanium ultra-fine particle powder of about 5 nm diameter.

Desirably, the invention is characterized by that the process forming the seed layer includes a process for applying a solution that includes the titanium ultra-fine particle powder and a process for drying and baking.

According to such a construction, it is possible to arrange the titanium ultra-fine particle powder easily and uniformly.

Desirably, the invention is characterized by that the process forming the PZT thin film includes a spattering process.

Desirably, the process of forming the PZT thin film further includes an annealing process for crystallization.

According to such a construction, it is possible to easily form a good ferroelectric thin film in crystallinity by introducing an annealing process for crystallization. However, it is also possible to perform crystallization at a heating process in the following forming process or to form an electrode with an insulating film too, because crystal growth takes place at about 450° C., which is a lower temperature than that used by the related art.

The second method of the invention is characterized by including a process for applying a ferroelectric thin film liquid that includes ultra-fine particle powder comprising at least one kind of composing elements of the ferroelectric thin film on a surface of a substrate. A baking process is also included.

According to such a construction, crystallization from the ultra-fine particle powder advances well by forming a thin film that includes ultra-fine particle powder. Thus, it is possible to form a thin film that is uniform and high in reliability.

Desirably, the invention is characterized by including a process for applying a PZT applying liquid that includes ultra-fine particle powder that becomes a seed on a surface of a substrate. A baking process is also included.

According to such a construction, crystal growth starts from a seed consisting of titanium ultra-fine particle powder of about 5 nm particle diameter scattered uniformly throughout the ferroelectric thin film. Therefore, it is possible to form a PZT ferroelectric thin film that is uniform and good in crystallinity because crystallization advances well, thereby making the titanium particle powder a nucleus.

Desirably, the invention is characterized by further including an annealing process for crystallization.

According to such a construction, it is possible to form easily a good ferroelectric thin film in crystallinity by introducing an annealing process for crystallization. However, it is possible to perform crystallization at a heating process in the following forming process or to form an electrode with an insulating film too, because crystal growth takes place at about 450° C., which is a lower temperature than that used by the related art.

The third invention is characterized in that forming the ferroelectric film is performed by forming a seed layer including an ultra-fine particle powder. The ultra-fine particle powder includes a composing element of the ferroelectric thin film on a surface of a floating gate before forming the ferroelectric substance thin film. Crystal growth makes the ultra-fine particle powder a nucleus for a method of manufacturing a ferroelectric consisting of an FET of an MFMIS structure.

According to such a construction, it is possible to obtain a ferroelectric thin film that is uniform and good in crystallinity because crystallization advances well, thereby making the ultra-fine particle powder a nucleus through the presence of the ultra-fine particle powder of about 5 nm diameter. Thus, it is possible to form a ferroelectric memory that is high in reliability.

In the fourth invention, a forming process of the ferroelectric film is performed by applying a ferroelectric thin film applying liquid. The liquid includes an ultra-fine particle powder comprising at least one kind of composing elements of the ferroelectric thin film on a surface of a substrate. The ferroelectric thin film is formed so as to make it crystallize to produce a ferroelectric memory consisting of an FET of an MFMIS structure.

According to such a construction, a uniform ferroelectric thin film is obtained because crystal growth starts from a seed scattered uniformly throughout the ferroelectric thin film, and it is possible to form a ferroelectric memory that is high in reliability at micronization.

The fifth invention is characterized in that a ferroelectric thin film of the ferroelectric capacitor is formed by applying a ferroelectric thin film applying liquid. The liquid includes ultra-fine particle powder comprising at least one kind of composing elements of the ferroelectric thin film on a surface of a first electrode. Crystallization is performed to produce a ferroelectric memory consisting of a switching transistor and a ferroelectric capacitor.

According to such a construction, a uniform ferroelectric thin film is obtained because crystal growth starts from a seed scattered uniformly throughout the ferroelectric thin film, and it is possible to form a ferroelectric memory that is high in reliability at micronization.

The sixth invention is characterized in that a ferroelectric thin film of the ferroelectric capacitor is formed by forming a strong seed layer including ultra-fine particle powder. The powder includes at least one kind of composing elements of the ferroelectric thin film on a surface of a first electrode. The ferroelectric thin film is formed on an upper layer of the seed layer. The ferroelectric thin film comprises crystals of all sizes. Crystallization produces a ferroelectric memory consisting of a switching transistor and a ferroelectric capacitor.

According to such a construction, it is possible to obtain a ferroelectric thin film that is uniform and good in crystallinity because crystallization advances well, thereby making the ultra-fine particle powder a nucleus and to form a ferroelectric memory high in reliability by existence of the titanium ultra-fine particle powder of about 5 nm diameter.

DETAILED DESCRIPTION OF THE PREFERRED EMBODIMENT

An embodiment of a ferroelectric memory and a method of manufacturing the same according to the invention will be described referring to the above-referenced drawings.

(Embodiment 1)

Figure 1:
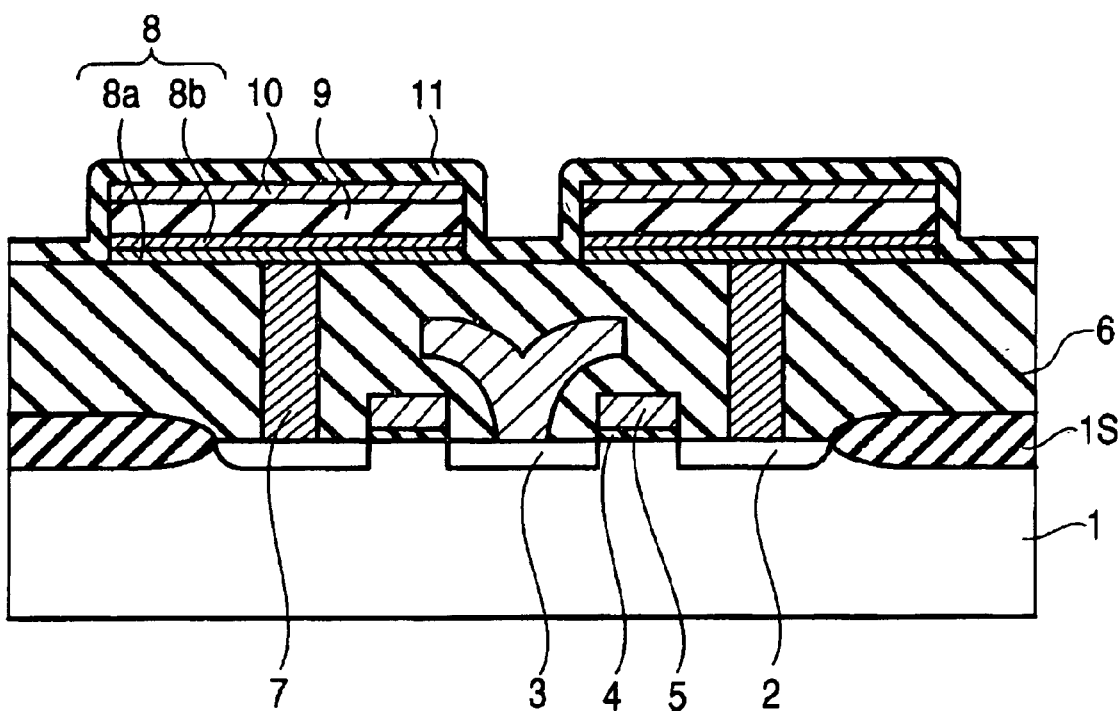
FIG. 1 is a view showing an FRAM using an insulating film formed by a method of a first embodiment of the invention.

A ferroelectric memory using a ferroelectric capacitor using a PZT as a ferroelectric film will be described in a first embodiment of the invention. A view of the ferroelectric memory is shown in FIG. 1 and manufacturing process views are shown in FIGS. 2A to 2E. The ferroelectric memory relates to a ferroelectric memory (FRAM) forming a ferroelectric capacitor on an insulating film 6 covering a surface of a substrate so as to connect one side of source-drain regions 2 and 3 of an MOSFET functioning as a switching transistor formed in a silicon substrate 1 and lower electrodes 8a and 8b through plugs 7. Crystallinity of a ferroelectric thin film 9 of the ferroelectric capacitor is uniform. Here, symbol 5 is a gate electrode formed on the surface of the substrate through a gate insulating film 4. The ferroelectric thin film 9 includes a crystal having a uniform particle diameter of crystal formed so as to generate crystal growth from the titanium ultra-fine particle powder by previously forming a seed layer, including titanium ultra-fine particle powder on a surface of the lower electrode.

That is, as shown in FIG. 1, the plugs 7 of polycrystalline silicon layer doped in high density are formed, the lower electrodes 8 of two layers film of iridium 8a and iridium oxide 8b are formed, and a ferroelectric thin film 9 in uniform crystallinate (See FIG. 3) is formed on the lower electrodes 8 by crystal growth making a seed layer S of titanium ultra-fine particle powder a nucleus and further forming upper electrodes 10 of two layers film of iridium oxide and iridium on the upper layer of the ferroelectric thin film.

Next, a process for manufacturing the ferroelectric memory will be described with reference to FIGS. 2A to 2E.

Figure 2A:
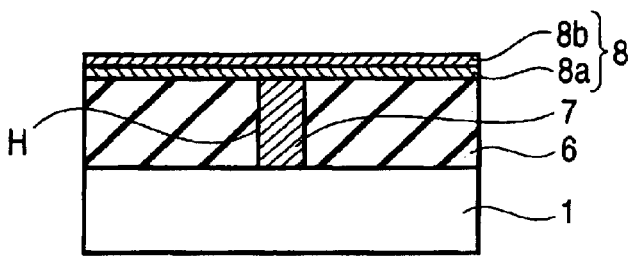
FIGS. 2A to 2E are views showing a manufacturing process of the FRAM of FIG. 1.

First, thermal oxidation is performed about the surface of the silicon substrate 1 forming a MOSFET (not shown) in an element region formed with an element separating insulating film 1S formed by LOCOS method. After forming the insulating film 6 of silicon oxide of about 600 nm in film thickness, a contact hole H is formed at the insulating film 6. After a polycrystal silicon layer is doped in high density in the contact hole so as to form the plug 7, an iridium layer 8a of about 200 nm film thickness is formed throughout the surface of the substrate by a spattering method and the surface thereof is oxidized so as to become iridium oxide 8b as shown in FIG. 2A.

Continuously, the iridium oxide layer is patterned by photolithography so as to form the lower electrode 8.

Figure 2B:
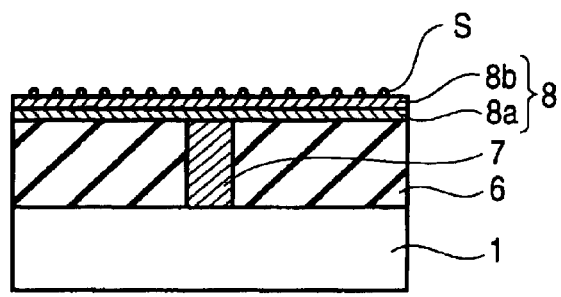

After that, Ti ultra-fine particle powder of about 5 nm particle diameter is mixed with a surface active agent of 0.1 to 10 wt % and α terpineol. The mixed liquid is applied as shown in FIG. 2B.

Figure 2C:
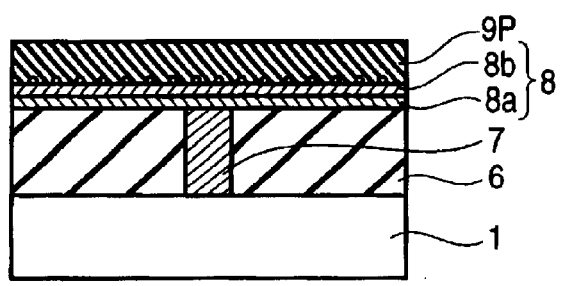
Figure 2D:
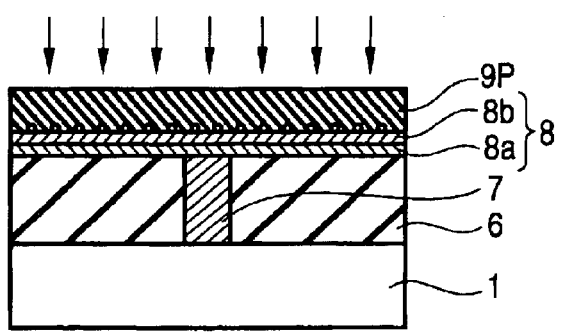

After that, a PZT film 9P for forming the ferroelectric film 9 is formed as shown in FIG. 2C. Mixed solution of $Pb(CH_3COO)_2.3H_2O$, $Zr(t-OC_4H_9)_4$, and $Ti(i-OC_3H_7)_4$ is used as a starting material. After spin coating the mixed solution, the film is dried at 150° C., and temporary baking of 400° C. for 30 minutes is performed under a dry air atmosphere. This is repeated five times. After that, thermal treatment of about 450° C. for one minute under a atmosphere of $O_2$ is performed as shown in FIG. 2D.

Figure 2E:
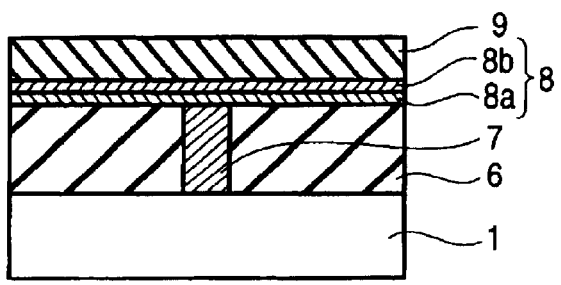

Thus, a ferroelectric film 9 of 250 nm is formed as shown in FIG. 2E. Here, the PZT film is formed placing 0.52 for x (PZT (52/48) hereafter) in $PbZr_xTi_{1-x}O_3$.

Laminating layers of film of iridium oxide and iridium are formed on the ferroelectric film 9 by spattering. The laminating layers of film of iridium oxide layer and iridium layer form an upper electrode 10 as shown in FIG. 1. Here, the iridium layer and the iridium oxide layer are formed so that the thickness is about 200 nm in all. Thus, a ferroelectric capacitor is obtained.

Figure 3:
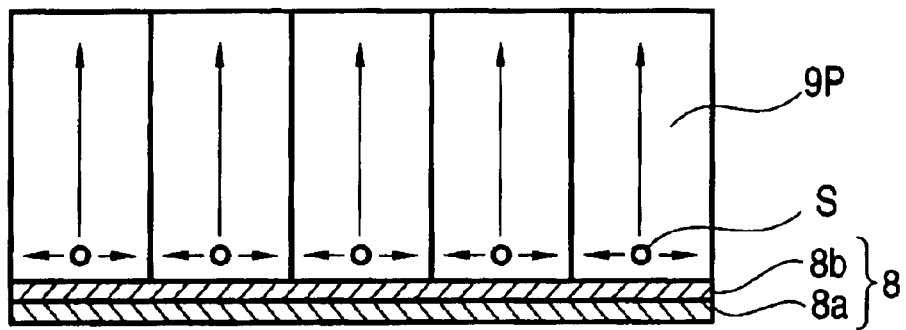
FIG. 3 is a view depicting a method of the first embodiment of the invention.

According to such a structure, it is possible to obtain a ferroelectric thin film that is uniform and good in crystallinity because crystallization advances well, thereby making the ultra-fine particle powder a nucleus through the presence of the ultra-fine particle powder as shown in FIG. 3.

It is desirable that the ultra-fine particle powder has a particle diameter from 0.5 nm to about 200 nm, preferably from 1 nm to about 50 nm.

Incidentally, some minimum of atoms is needed for the ultra-fine particle powder to become a nucleus, as the ultra-fine particle powder can not become the nucleus with one atom. It is desirable that the nucleus be sufficiently larger than the atomic size of about 0.1 nm. On the other hand, when the nucleus is too large, the center of the nucleus remains as Ti. Therefore, a high annealing temperature is needed converting Ti. It is impossible to form a flat and uniform ferroelectric thin film when the size is larger than 200 nm. The nucleus is hard to scatter in solution when the nucleus is large.

Further, the concentration is desirable to be from 0.00001 wt % (0.1 wtppm) to about 1 wt %. Although a substance that the circumference of Ti ultra-fine particle powder is covered with is a surface active agent and organic solvent such as α terpineol is mixed for forming the seed layer, it is also possible to use xylene, toluene, 2-methoxyethanol, butanol and so on as an organic solvent.

Desirably, at the process forming the seed layer, solution including the titanium ultra-fine particle powder is applied, and after that, drying and baking are performed.

According to such a construction, it is possible to arrange the titanium ultra-fine particle powder easily and uniformly.

The process forming the PZT thin film may be by any spattering method, except sol-gel method.

Desirably, the process forming the PZT thin film further includes an annealing process for crystallization.

According to such a construction, it is possible to easily form a good ferroelectric thin film in crystallinity by introducing an annealing process for crystallization. It is also possible to perform crystallization at a heating process in the following forming process or to form an electrode with an insulating film by crystal growth at about 450° C., which is lower temperature than the related art.

Although the ferroelectric memory using PZT as the ferroelectric thin film is described for the first embodiment, of the invention, it is not necessary to point out that another material, such as the ferroelectric memory using STN as the ferroelectric film, may be applicable.

(Embodiment 2)

Figure 4:
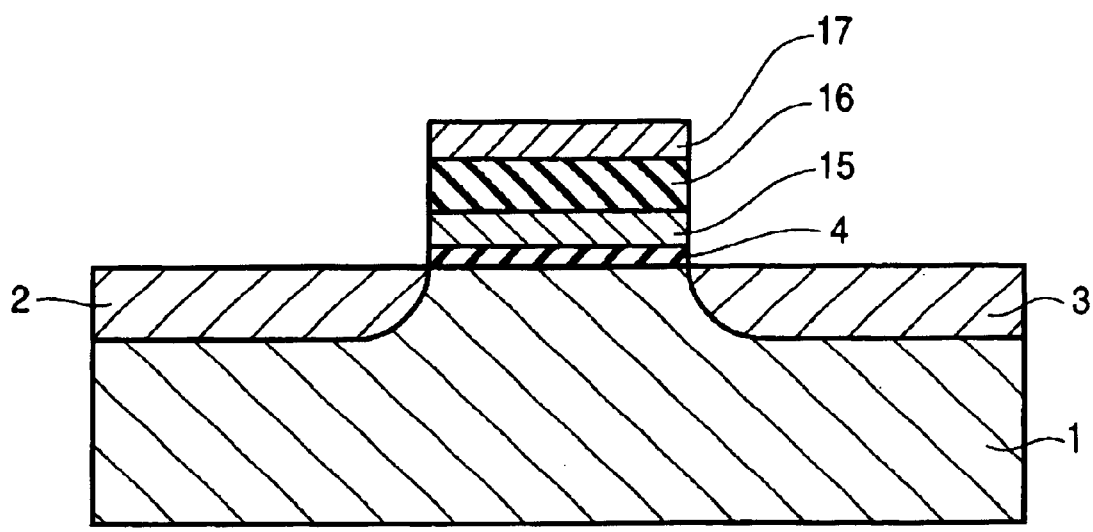
FIG. 4 is a view showing an FRAM formed by a method of a second embodiment of the invention.

Next, a manufacturing process of a ferroelectric memory of the MFMIS structure will be described. FIG. 4 is a view showing the ferroelectric memory formed by the method of the invention, and FIGS. 5A to 5E are views of the manufacturing process.

In this example, a ferroelectric thin film 16 of the ferroelectric memory of the MFMIS structure is formed by applying sol-gel liquid including Ti ultra-fine particle powder, and after baking, by crystallization-annealing so as to form the ferroelectric thin film 16 that is uniform and high in crystallinity.

That is, the ferroelectric memory is constructed by forming source-drain regions 2 and 3 on a surface of a silicon substrate 1, forming a floating gate 15 between them through a gate insulating film 4, forming a ferroelectric thin film 16 on the floating gate 15, and forming a control gate 17 on the ferroelectric thin film 16.

Figure 5A:
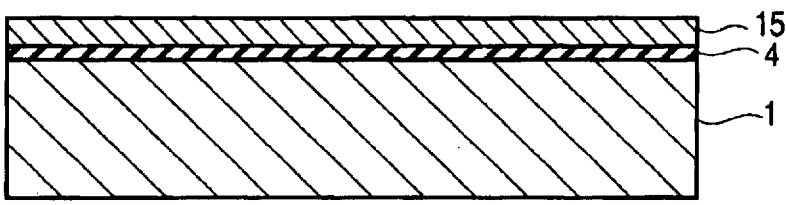
FIGS. 5A to 5E are views showing a manufacturing process of the FRAM of FIG. 4.

During manufacturing, as shown in FIG. 5A, after the surface of n-type silicon substrate 1 is oxidized thermally so as to form a silicon oxide layer 4 of about 20 nm film thickness, an iridium layer that becomes the floating gate 15 is formed on the silicon oxide layer 4 using iridium as a target by a spattering method. Next, a thermal treatment is performed at 800° C. for one minute under a atmosphere of $O_2$ so as to form an iridium oxide layer on a surface of the iridium layer.

Figure 5B:
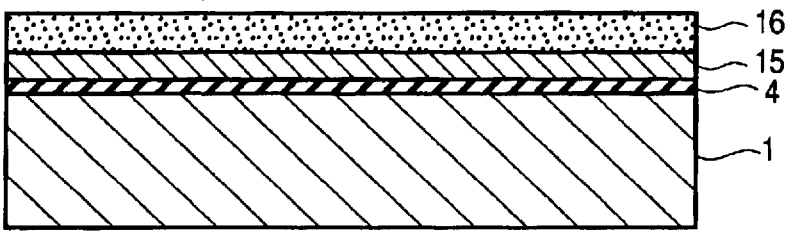
Figure 5C:
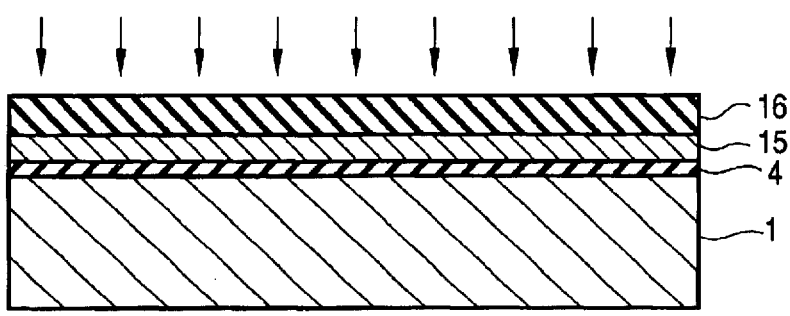

Next, a PZT film is formed on the floating gate 15 as the ferroelectric film 16 by a sol-gel method as shown in FIG. 5B. Titanium ultra-fine particles of 5 nm particle diameter and of 0.5 wt %, a surface active agent of 1 wt %, and mixed solution of $Pb(CH_3COO)_2.3H_2O$, $Zr(t-OC_4H_9)_4$, and $Ti(i-OC_3H_7)_4$ are used as starting materials. After spin coating the mixed solution, the film is dried at 150° C., and temporary baking of 400° C. for 30 minutes is performed under a dry air atmosphere. After this is repeated five times, thermal treatment of 500° C. for one minute under an atmosphere of $O_2$ is performed as shown in FIG. 5C. Thus, a ferroelectric film 16 of 250 nm is formed. Here, the PZT film is formed placing 0.52 for x in $PbZr_xTi_{1-x}O_3$ (PZT(52/48), hereinafter).

Here, a uniform ferroelectric thin film can be obtained because crystal growth starts from the seed scattered uniformly throughout the ferroelectric thin film so as to form a ferroelectric thin film that is high in reliability at micronization.

Further, an iridium layer and an iridium oxide layer are formed on the ferroelectric film 16 by spattering so as to form a control gate 17. Here, the iridium layer and the iridium oxide layer are formed so as to be 200 nm in thickness.

Figure 5D:
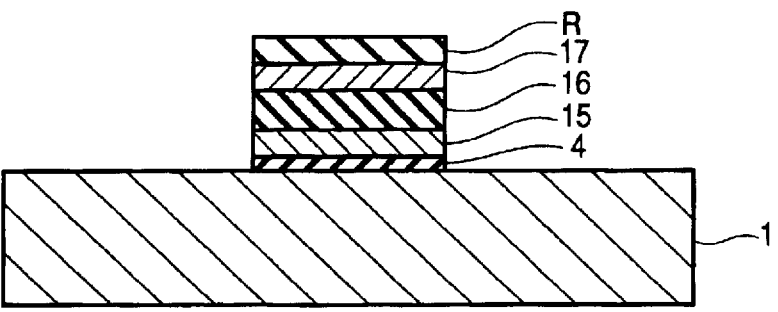

Then, a resist pattern R is formed on the upper layer thereof and each layer is patterned, masking the pattern as shown in FIG. 5D so as to expose the surfaces of the regions that become the source-drain.

Figure 5E:
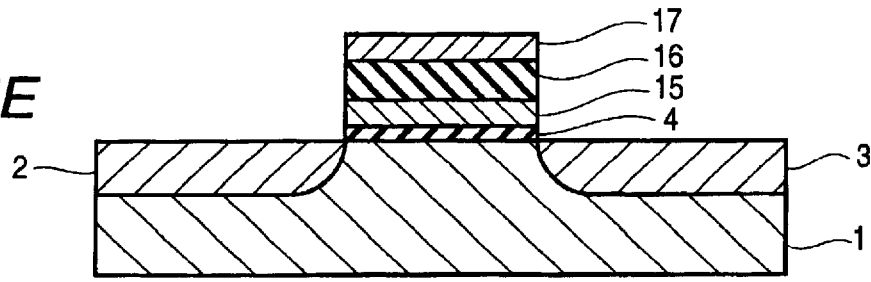
Figure 6:
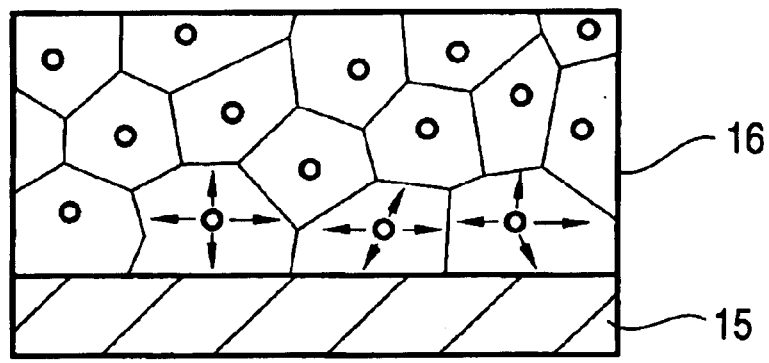
FIG. 6 is a view depicting a method of the second embodiment of the invention.
Figure 7:
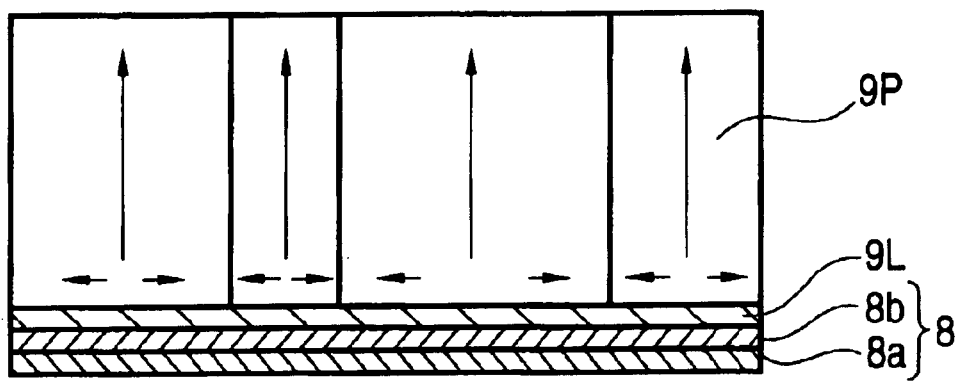
FIG. 7 is a view depicting a method of the related art.

After that, by injecting boron (B) ion to mask the gate electrode pattern, source-drain regions 2 and 3 of p-type diffusion layer are formed as shown in FIG. 5E.

Further, forming an insulating film layer and a wiring pattern, a ferroelectric memory is completed.

According to such a structure, since the ferroelectric film formed between the floating gate and the control gate is a film that is uniform and good in crystallinity, the memory has high reliability without having dispersion of characteristics.

Although PZT is used for the ferroelectric film, the ferroelectric such as STN, SBT and the like or the high permittivity dielectric film such as BST and the like are possible to apply. Material included in composing the element of the ferroelectric film may be used as the ultra-fine particle powder.

As described above, the invention forms a seed layer including ultra grain particles containing an element that constitutes a ferroelectric thin film on a surface of a substrate before forming the ferroelectric thin film and forms the ferroelectric thin film on an upper layer of the seed layer so as to perform crystallization making the seed layer a nucleus. Therefore, it is possible to obtain a ferroelectric thin film that is uniform and good in crystallinity because crystallization advances well, thereby making the ultra-fine particle powder a nucleus by existence of the ultra-fine particle powder.

The method of the invention includes applying a ferroelectric thin film applying liquid that includes ultra-fine particle powder containing at least one kind of the elements constituting the ferroelectric thin film on a surface of a substrate and forms a thin film including ultra-fine particle powder. Therefore, crystallization advances well from the ultra-fine particle powder because a thin film is formed that includes ultra-fine particle powder that is scattered throughout the thin film and it is possible to form a thin film that is uniform and high in reliability.

What is claimed is:

1. A method of forming a ferroelectric thin film including:
   applying a liquid to a surface of a substrate for forming the ferroelectric thin film, the liquid including an ultra-fine particle powder comprised of at least one element constituting the ferroelectric thin film; and
   baking the liquid applied to the surface of substrate.

2. The method of forming a ferroelectric thin film according to claim 1, further comprising crystallizing the ferroelectric thin film by annealing.

3. The method of forming a ferroelectric thin film according to claim 2, wherein the annealing step is a separate step from the baking step.

4. The method of forming a ferroelectric thin film according to claim 2, wherein the annealing step is included in the baking step.

* * * * *